(12) United States Patent
Lee et al.

(10) Patent No.: US 8,309,998 B2
(45) Date of Patent: Nov. 13, 2012

(54) MEMORY STRUCTURE HAVING A FLOATING BODY AND METHOD FOR FABRICATING THE SAME

(75) Inventors: Tzung-Han Lee, Taipei (TW); Chung-Yuan Lee, Tao-Yuan (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 13/102,039

(22) Filed: May 5, 2011

(65) Prior Publication Data
US 2012/0168857 A1    Jul. 5, 2012

(30) Foreign Application Priority Data
Jan. 3, 2011   (TW) .............................. 100100048 A

(51) Int. Cl.
*H01L 27/108* (2006.01)
(52) U.S. Cl. . 257/296; 257/302; 257/330; 257/E27.084; 438/270
(58) Field of Classification Search ................. 257/296, 257/301, 302, 330–332, 334, 368, E27.084, 257/E29.262; 438/270
See application file for complete search history.

(56) References Cited

U.S. PATENT DOCUMENTS

| | | | |
|---|---|---|---|
| 6,521,935 B2 * | 2/2003 | Krautschneider et al. | 257/296 |
| 7,433,234 B2 | 10/2008 | Morikado | |
| 7,548,447 B2 * | 6/2009 | Kim et al. | 365/150 |
| 7,719,869 B2 * | 5/2010 | Slesazeck | 365/63 |
| 8,084,316 B2 * | 12/2011 | Huo et al. | 438/212 |
| 2002/0017671 A1 * | 2/2002 | Goebel et al. | 257/301 |
| 2009/0261411 A1 | 10/2009 | Wu | |

FOREIGN PATENT DOCUMENTS

| | | |
|---|---|---|
| TW | 469599 | 12/2001 |
| TW | 200847425 | 12/2008 |

* cited by examiner

*Primary Examiner* — Tuan N. Quach
(74) *Attorney, Agent, or Firm* — Winston Hsu; Scott Margo

(57) ABSTRACT

A memory structure having a floating body is provided, which includes a substrate including an active area and an isolation structure surrounding the active area, a first source/drain region in the substrate in the active area, a first floating body in the substrate above the first source/drain region, a second floating body on the first floating body, a second source/drain region on the second floating body, and a trench-type gate structure in the substrate and beside the first floating body. A method of fabricating a memory structure having a floating body is also provided.

11 Claims, 9 Drawing Sheets

MEMORY STRUCTURE HAVING A FLOATING BODY AND METHOD FOR FABRICATING THE SAME

BACKGROUND OF THE INVENTION

1. Field of the Invention

The present invention relates to a semiconductor structure, and particularly to a dynamic random access memory (DRAM) having a floating body structure and a method for fabricating the same.

2. Description of the Prior Art

The conventional DRAM device is mainly consisted of a capacitor and a transistor. As the trend continues toward miniaturization for various electronic devices, DRAM having a reduced size is also desired. However, because the capacitor occupies most space in a conventional DRAM, it is difficult to reduce the total size. Thus, a capacitorless DRAM is developed. The known capacitorless DRAM is mainly consisted of a metal-oxide-semiconductor transistor disposed on a silicon-on-insulator (SOI) type substrate, in which, a floating body on the SOI substrate serves as a charge storage region, and a source and a drain are disposed along a horizontal direction (i.e. in a direction parallel to the original surface of the substrate) in the substrate beside two side ends of the floating body, respectively. Because the floating body replaces conventional large and complicated capacitor, it saves some space.

However, with the demand of miniaturization, there is still a need for a novel memory structure having a further small size or a novel method for manufacturing the same.

SUMMARY OF THE INVENTION

An object of the present invention is to provide a memory structure having a floating body and a method of fabricating the same. The memory structure has a relatively small size and the manufacturing method is easy.

In one aspect of the present invention, the memory structure according to the present invention includes a substrate including an active area and an isolation structure surrounding the active area, a first source/drain region disposed in the substrate in the active area, a first floating body disposed in the substrate above the first source/drain region, wherein the first floating body connects with the first source/drain region to have a first junction, a second floating body disposed on the first floating body, a second source/drain region disposed on the second floating body, wherein the second source/drain region connects with the second floating body to have a second junction, and a trench-type gate structure disposed in the substrate and beside the first floating body.

In another aspect of the present invention, the method for fabricating a memory structure according to the present invention includes steps as follows. A substrate is provided. The substrate includes an active area and an isolation structure surrounding the active area. A first type dopant is incorporated into the substrate in the active area to form a first source/drain region. A second type dopant is incorporated into the substrate above the first source/drain region to form a first floating body. The first floating body connects with the first source/drain region to have a first junction. A trench is formed in the substrate beside the active area. A gate structure is formed in the trench. A dielectric layer is formed all over the substrate. An opening is formed in the dielectric layer to expose the first floating body. A semiconductor material layer is formed within the opening and includes the second type dopant to form a second floating body at a lower portion of the semiconductor material layer. The second floating body and the first floating body merge to be one floating body. The first type dopant is incorporated into the semiconductor material layer above the second floating body to form a second source/drain region. The second source/drain region connects with the second floating body to have a second junction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
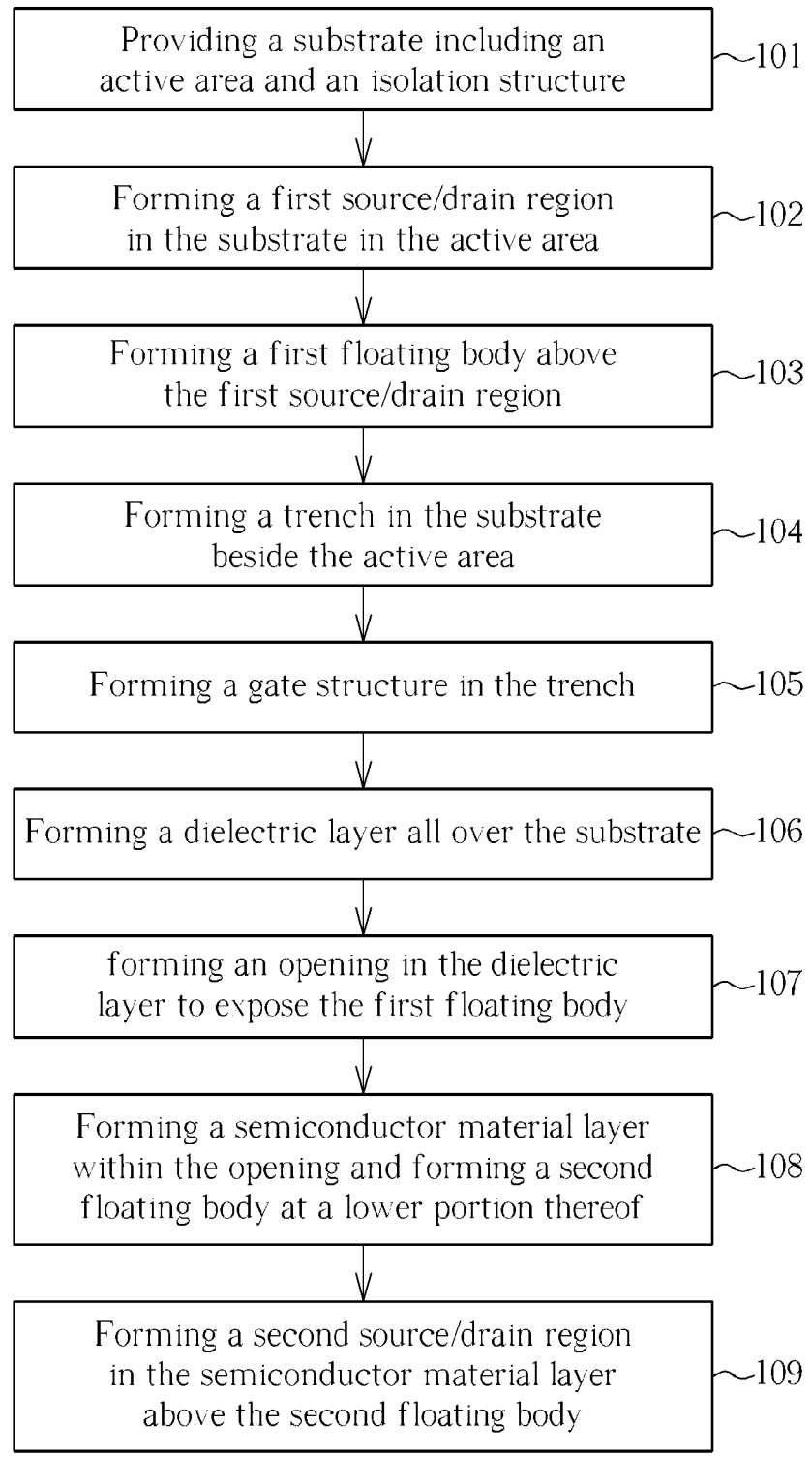
FIG. 1 is a flowchart illustrating an embodiment of the memory structure according to the present invention.
Figure 2:
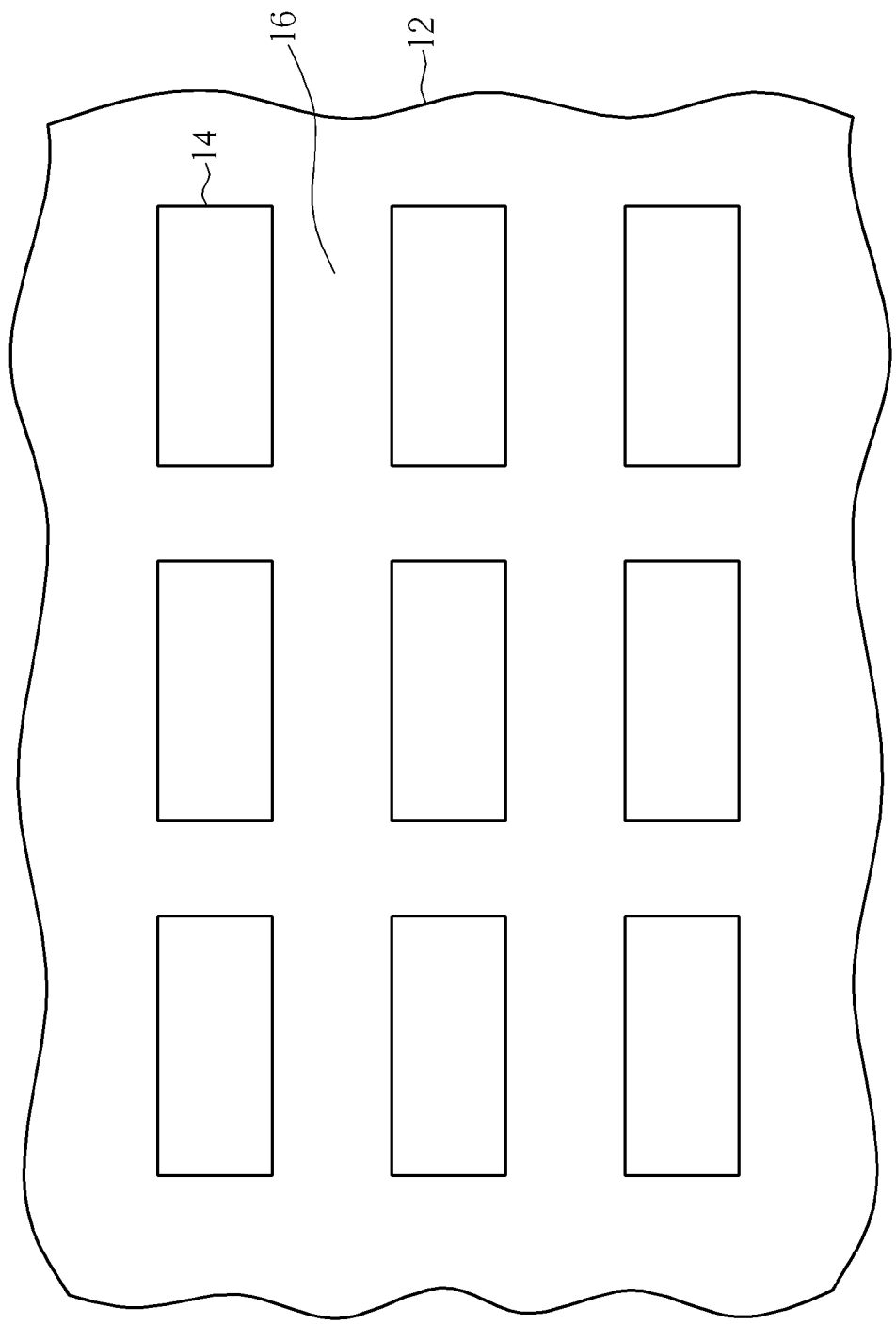
FIG. 2 is a schematic diagram illustrating an active area layout of an embodiment of the method for fabricating the memory structure according to the present invention.

Referring to FIGS. 2 to 9, as shown in the flow chart of FIG. 1, the method for fabricating a memory structure according to the present invention includes steps as follows. First, referring to FIG. 2, Step 101 is performed to provide a substrate 12. The substrate may be for example a conventional semiconductor substrate, as well as an SOI substrate. An active area 14 and an isolation structure 16 are defined in the substrate 12. The isolation structure 16 surrounds the active area 14 for electric insulation. When a memory cell array is fabricated, a plurality of active areas 14 may be defined on the substrate to form an array. An isolation structure 16 is disposed among the active areas 14 for isolation. The isolation structure 16 may be for example a shallow trench isolation (STI).

Figure 3:
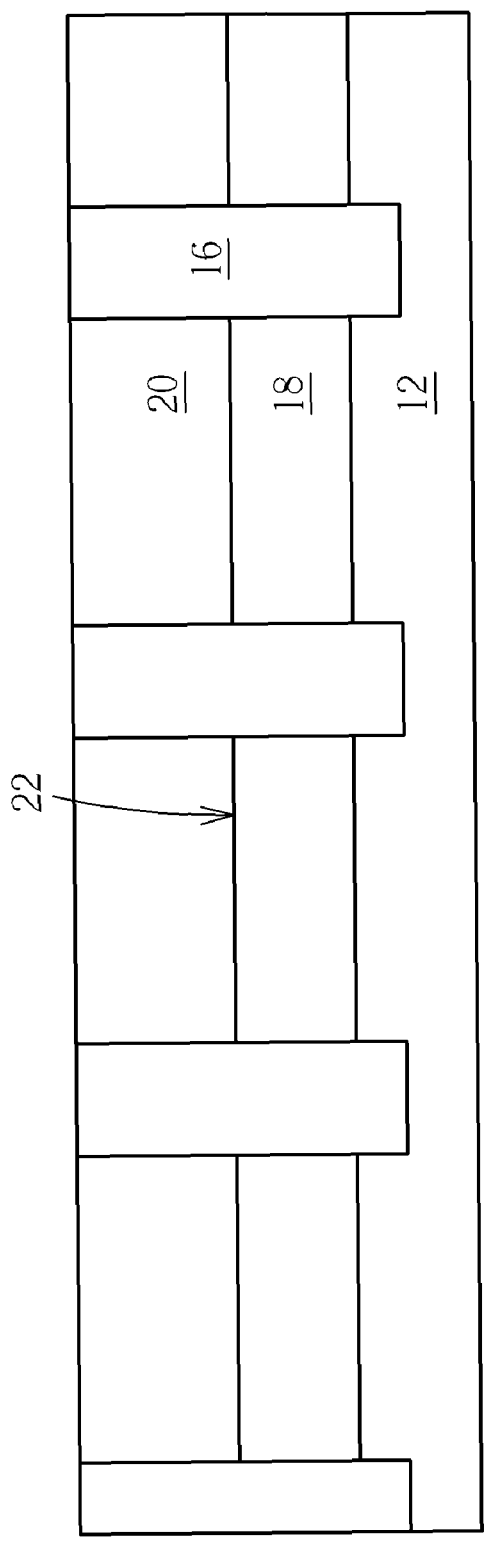
FIGS. 3 to 5 are schematic cross-sectional views illustrating an embodiment of the method for fabricating the memory structure according to the present invention.

Thereafter, as shown in FIG. 3, Step 102 is performed to incorporate a first type dopant into the substrate 12 in the active area 14 to form a first source/drain region 18. It may be accomplished by for example an ion implantation to implant the first type dopant, such as n type dopant, preferably with a relatively heavy concentration, i.e. $n^+$ type dopant, into the substrate 12 to form the source/drain region 18. The implantation may be carried out all over the substrate 12 in all active areas 14, and accordingly no mask is required for the implantation. The dopant concentration may depend on the desired. Thereafter, Step 103 is performed to incorporate a second type dopant into the substrate 12 above the first source/drain region 18 to form a first floating body 20. The second type dopant may be a dopant of charge opposite to the first dopant and in a relatively low concentration. In other words, when the first type dopant is an n type dopant, the second type dopant is a p type dopant, and preferably a $p^-$ type dopant; and when the first type dopant is a p type dopant, the second type dopant is an n type dopant, and preferably an $n^-$ type dopant. The first floating body 20 may be also formed through an implantation carried out all over the substrate 12 in all active areas 14 to implant the dopant into the substrate above the source/drain region 18, and accordingly a mask is not required, either. After the second dopant is incorporated into the substrate to form a first floating body 20, a first junction 22 is formed between the first floating body 20 and the first source/drain region 18.

Figure 4:
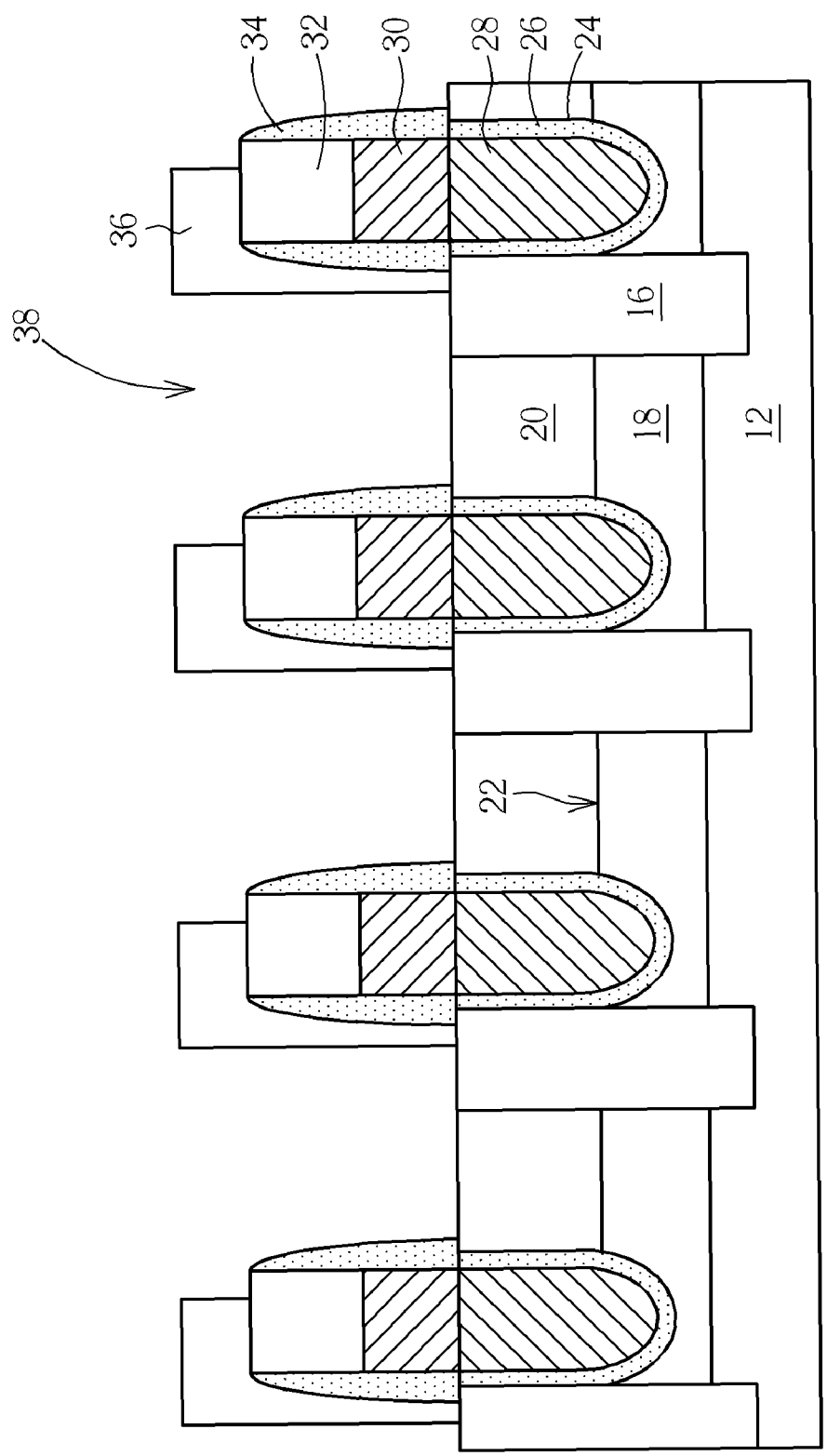

Thereafter, referring to FIG. 4 illustrating an embodiment in one aspect of the present invention, Step 104 is performed to form a trench 24 in the substrate 12 on one side of the active area 14. This may be accomplished through for example a conventional etching process. A portion of the side wall of the trench 24 is constituted by the first floating body 20, and the bottom of the trench 24 is allowed to be located within the first source/drain region 18. Furthermore, a portion of another side wall of the trench 24 may be constituted by the isolation structure 16. Thus, the trench 24 may use an entire area of a side surface of the active area 14. Step 105 is performed to form a gate structure in the trench 24. For example, a gate dielectric layer 26 is formed on the side wall and the bottom of the trench 24. A gate 28 is formed within and fills up the trench 24. The gate structure thus obtained is beside the first floating body and abuts upon the first floating body with a vertical side face. The gate dielectric layer 26 is between the gate 28 and the first floating body 20, and the gate channel is vertical. Although the first source/drain region and the first floating body are formed before the trench is formed in this embodiment, the trench and the gate structure may be formed before doping the first source/drain region and the first floating body in another embodiment according to the present invention.

Thereafter, a word line 30 is formed above the gate 28. This may be accomplished through for example conventional electric plating or deposition and etching processes, which depend on the material of the word line. The material may be for example tungsten. To manufacture an array of memory cells, the word line 30 is allowed to electrically connect the gates 28 of the memory cells listed in a same line or column. In this embodiment, it is allowed to directly connect each gate in a same column. More specifically, for example, the word line 30 is allowed to cross over the isolation structure 16 to connect with the gates 28 of two adjacent memory cells. A cap layer 32 is formed to cover the word line 30. The cap layer may include material such as silicon nitride to form a barrier of moisture. Thereafter, a spacer 34 is formed on each of two side walls of the word line 30. The spacer may include silicon nitride.

Thereafter, Step 106 is performed to cover a dielectric layer 36 all over the substrate 12. The dielectric layer may include a material conventionally used for a dielectric layer, for example an oxide. Thereafter, Step 107 is performed to form an opening 38 in the dielectric layer 36 to expose the first floating body 20. The entire top surface of the first floating body 20 may be exposed. This may be accomplished by for example an etching process with a mask. Nevertheless, for the demand of feature size in the manufacturing process, it may be not only to expose the first floating body 20, but also to expose the word line structure and/or gate structure and/or isolation structure 16. Since the word line and the gate have been well protected by the spacer 34 and the cap layer 32, the electric insulation for the gate and the word line will not be deteriorated.

Figure 5:
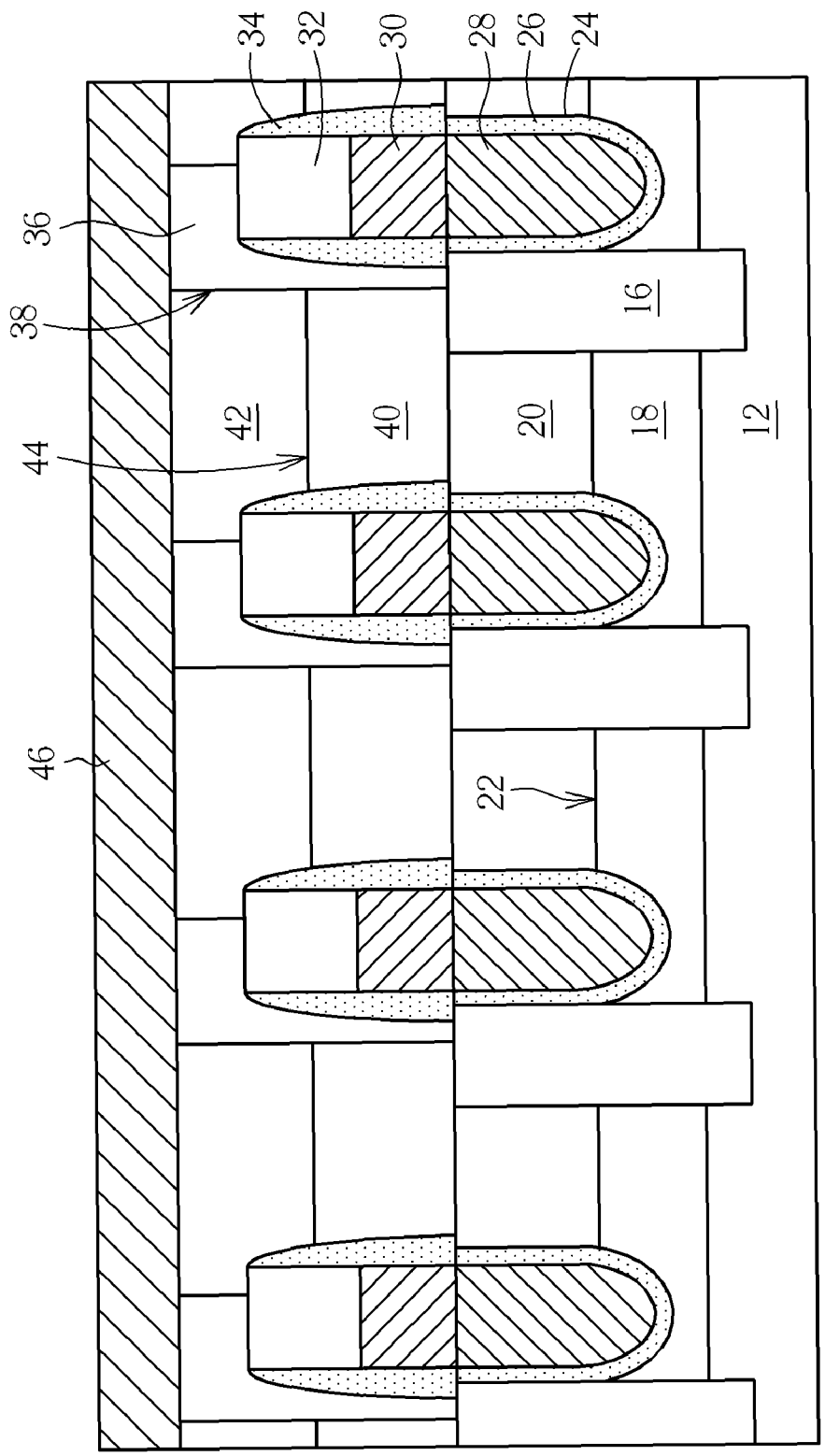

Referring to FIG. 5, thereafter, Step 108 is performed to from a semiconductor material layer within the opening and to allow at least a lower portion of the semiconductor material layer doped with the second type dopant to form a second floating body 40. The second floating body 40 and the first floating body 20 merge to become one floating body. The semiconductor material layer may be formed, for example, through an epitaxial growth process to grow an epitaxial layer including the same material as the first floating body. If the first floating body is a silicon layer with the second type dopant, the epitaxial layer is the same. Accordingly, the lower portion of the epitaxial layer may serve directly as the second floating body 40. In another embodiment, the semiconductor material layer may be formed, for example, through a deposition process to form for example a polysilicon layer within the opening 38 and optionally an etch back process, and then the second type dopant is incorporated into the lower portion of the semiconductor material layer to form the second floating body 40. Thus, even the first floating body 20 is just in a small size and accordingly carries small amount of charges, the second floating body 40 can provide more charges to increase total charges.

Thereafter, Step 109 is performed to incorporate the first type dopant into the semiconductor material layer above the second floating body 40 to form a second source/drain region 42. If a portion of the word line structure is also exposed from the opening 38, a portion of the second source/drain region 42 thus formed will be right (directly) above the word line structure. The second source/drain region 42 connects with the second floating body 40 to have a second junction 44. No mask is required for the implantation of dopant into the second floating body 40 (if desired) and the second source/drain region 42.

Figure 9:
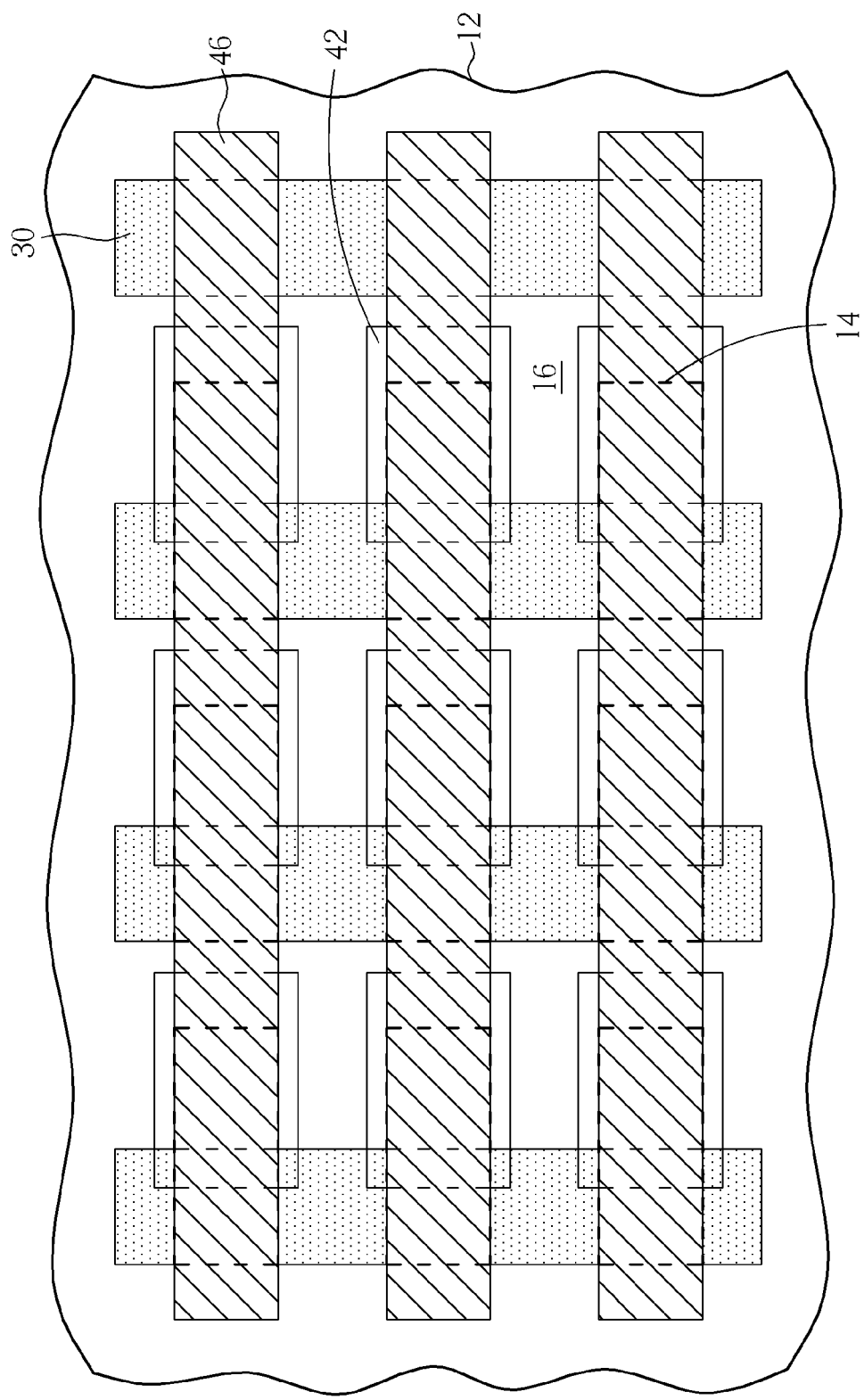
FIG. 9 is a schematic diagram illustrating a plan layout according to the embodiment as shown in FIG. 5.

FIG. 9 shows a plan layout corresponding to the schematic cross-sectional view of an embodiment of the memory structure as shown in FIG. 5, for further helping understanding the present invention.

In the method for fabricating a memory structure according to the present invention, a bit line may be formed above the second source/drain region 42 and allowed to electrically connect to the second source/drain region. The electric connection may be a direct connection or a connection through a conductive structure (such as a conductive plug). As shown in FIG. 5, the bit line 46 directly connects to the second source/drain region 42. To manufacture an array of memory cells, the bit line 46 is allowed to cross over the dielectric layer 36 to electrically connect the second source/drain regions 42 of memory cells listed in a same line. The bit line may be formed through for example conventional electric plating or deposition and etching processes, which depend on the material of the bit line.

Figure 6:
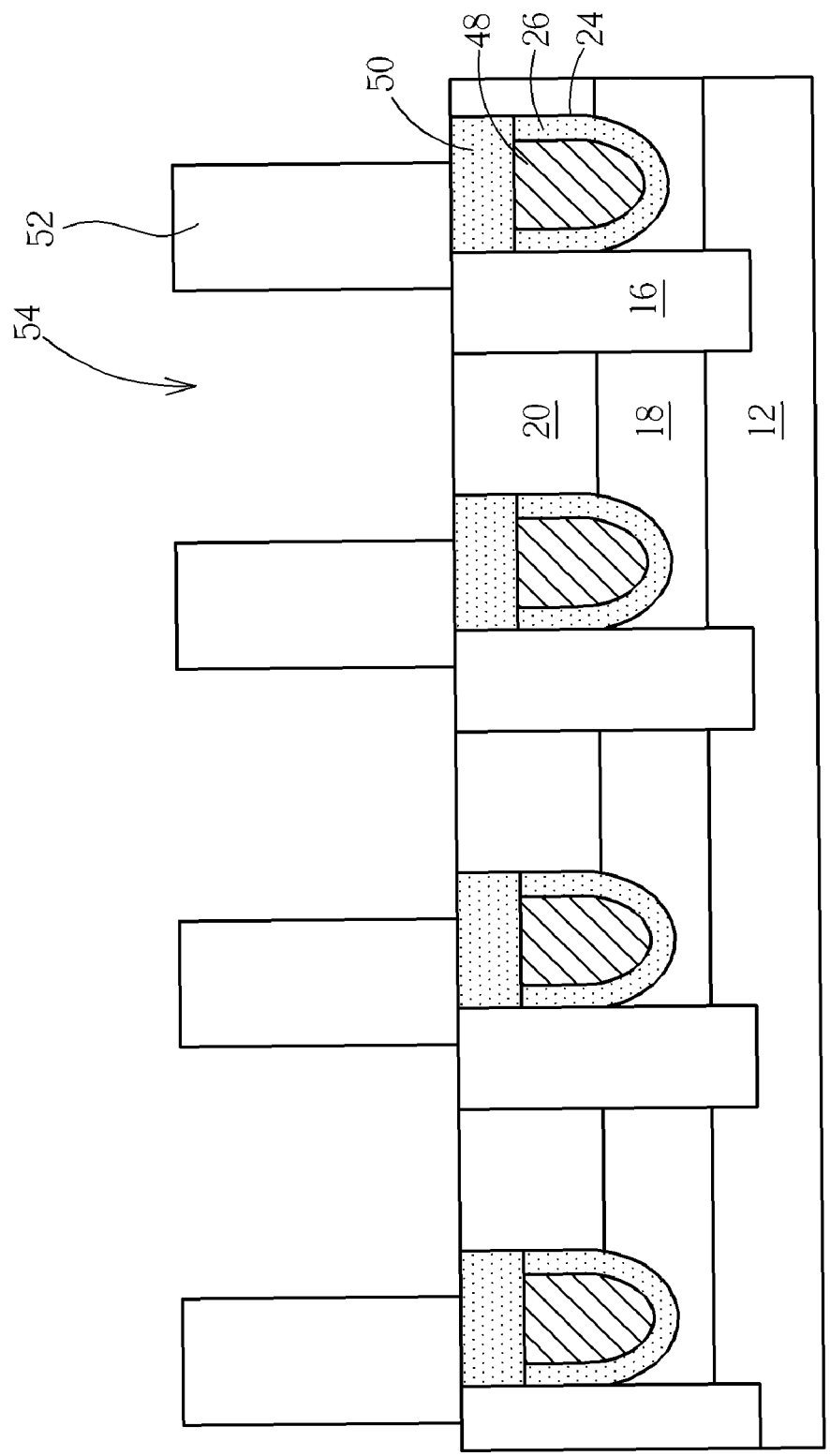
FIGS. 6 and 7 are schematic cross-sectional views illustrating another embodiment of the method for fabricating the memory structure according to the present invention.

In the method for fabricating a memory structure according the present invention, the gate structure may be fabricated in various aspects. FIG. 6 shows another aspect. After Step 104 is performed to form the trench 24 in the substrate 12 on one side of the active area 14, Step 105 is performed to form a gate structure within the trench 24. The gate structure may be formed by steps as follows. For example, a gate dielectric layer 26 is formed on a side wall and a bottom of the trench 24, and a gate 48 is formed within the trench 24 but not fill up the trench 24. Thereafter, a cap layer 50 is formed to cover the gate 48. The trench 24 may be formed such that it passes through the active areas 14 and the isolation structure 16 of a whole line. Thus, with respect to the formation of the gate structure, the step of filling the trench to form the gate 48 may be equivalent to the step of forming a buried word line. The conductive material filled in the trench may be one or more types of material. In such manner, the trench entirely passes through the active areas and the isolation structure all along. That is, the bottom of the trench for the isolation structure 16 and the bottom of the trench for the active area 14 are in a same level of height. Another manner is to only allow the upper portion of the trench to pass through, that is, the bottom of the trench for the isolation structure 16 is higher than the bottom of the trench for the active area 14. Accordingly, the lower portion (located in active area 14) of the trench may be filled with gate material, and the upper portion (located in the active area and the isolation structure 16) of trench may be filled with bit line material to form a buried bit line. These two materials may be same or different. Thereafter, a cap layer 50 is formed to cover the word line. A spacer may be formed on each of two side walls of the word line if desired.

Figure 7:
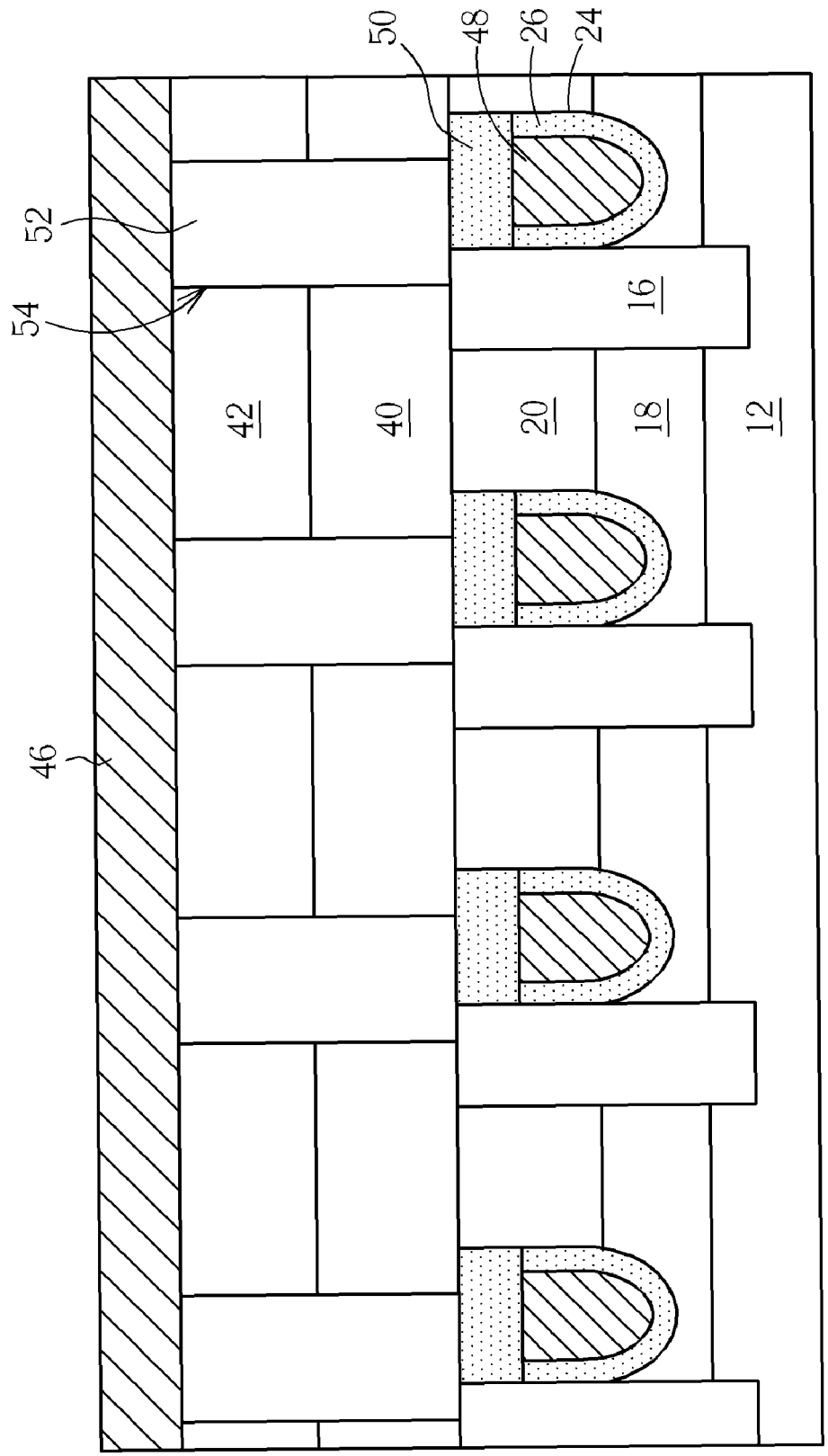

Thereafter, Step 106 is performed to form a dielectric layer 52 covering all over the substrate 12. Thereafter, Step 107 is performed to form an opening 54 within the dielectric layer 52 to expose the first floating body 20. As the aforesaid, it may be not only to expose the first floating body 20, but also to expose the gate structure (including the word line structure) and the isolation structure 16. The electric insulation for the gate and the word line will not be deteriorated. Referring to FIG. 7, thereafter, Step 108 is performed as the aforesaid to form a semiconductor material layer within the opening 54 and to allow at least a lower portion of the semiconductor material layer doped with the second type dopant to form a second floating body 40. A portion of the second floating body 40 thus formed will be disposed right (directly) above the gate structure and the word line structure. Step 109 is performed as the aforesaid to incorporate the first type dopant into the semiconductor material layer above the second floating body 40 to form the second source/drain region 42. As the aforesaid, a bit line 46 may be further formed on the second source/drain 42 to electrically connect to the second source/drain 42.

Figure 8:
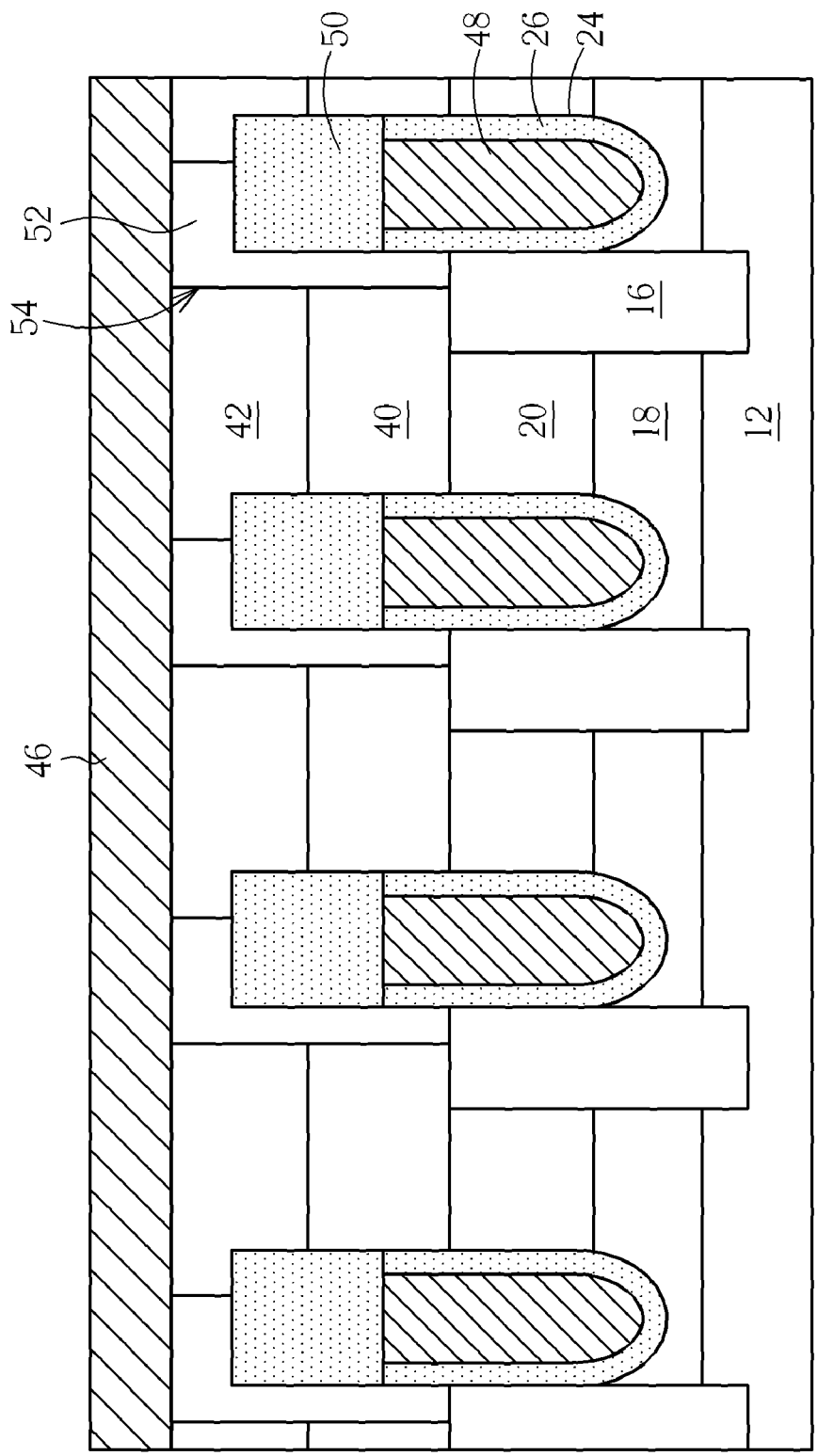
FIG. 8 is a schematic cross-sectional view illustrating further another embodiment of the method for fabricating the memory structure according to the present invention.

In an embodiment of the memory structure according to the present invention as shown in FIG. 7, the gate structure is disposed under an original surface of the substrate; however, there is no limitation for the gate structure to be under the original surface of the substrate. The gate structure may be formed to be in the substrate and extend to be above the original surface of the substrate, as shown in FIG. 8. Such gate structure may be formed as follows. After the trench is formed as the aforesaid Step 104, a gate dielectric layer is formed in the trench, and the trench is filled with gate material. A dielectric layer is formed on the substrate. An opening is formed within the dielectric layer and the opening is allowed to joint the trench filled with the gate material. Then, it continues to complete the upper portion of the gate structure. The dielectric layer may be or may be not formed on the completed gate structure. The dielectric layer formed on the first floating body 20 is removed to form an opening, as the aforesaid Step 107. Thereafter, the memory structure is completed as the aforesaid Steps 108 and 109. Thus, the portion of the gate structure extending to be above the original surface of the substrate is located beside the second floating body 40.

In the memory structure according to the present invention, the source/drain regions are located beside two upper and lower ends of a floating body, respectively, and the size of each elements in a horizontal direction may be small, even down to feature size of the manufacturing process. Accordingly, the memory cell has a small size in a horizontal direction and can be easily fabricated using the method according to the present invention. The floating body is allowed to connect to two source/drain regions, one at the upper end and the other at the lower end, each to form a conjunction (such as npn or pnp), and accordingly an energy level exists. For example, the source/drain regions beside the two ends are $n^+$ type doped and both are able to provide charges. The potential difference between the word line and the bit line is adjusted such that the charges can stay in the floating body. Just an amount of 2 to 5 Femtofarad (fF) of charges stored within the floating body may be sufficient for the work of the memory structure. When a greater amount of charges is desired, it only needs to increase the height of the floating body for increasing the amount of charges, without necessity of increasing the total horizontal area of memory cells.

Those skilled in the art will readily observe that numerous modifications and alterations of the device and method may be made while retaining the teachings of the invention.

What is claimed is:

1. A memory structure, comprising:
   a substrate comprising an active area and an isolation structure surrounding the active area;
   a first source/drain region disposed in the substrate in the active area;
   a first floating body disposed in the substrate above the first source/drain region, wherein the first floating body connects with the first source/drain region to have a first junction;
   a second floating body disposed on the first floating body;
   a second source/drain region disposed on the second floating body, wherein the second source/drain region connects with the second floating body to have a second junction; and
   a trench-type gate structure disposed in the substrate and beside the first floating body.

2. The memory structure according to claim 1, wherein,
   a semiconductor material layer is disposed on the first floating body,
   the second floating body is located at a lower portion of the semiconductor material layer, and
   the second source/drain region is located at an upper portion of the semiconductor material layer and above the second floating body.

3. The memory structure according to claim 1, wherein,
   the trench-type gate structure comprises a gate and a gate dielectric layer disposed between the substrate and the gate, and
   the memory structure further comprises a word line structure disposed above the gate and beside the second floating body.

4. The memory structure according to claim 3, wherein a portion of the second source/drain region is directly above the word line structure.

5. The memory structure according to claim 1, wherein,
   the trench-type gate structure is disposed in a trench,
   the trench-type gate structure comprises a gate and a gate dielectric layer disposed between the substrate and the gate, and
   the memory structure further comprises a word line structure disposed above the gate and in the trench.

6. The memory structure according to claim 5, wherein a portion of the second floating body is directly above the word line structure.

7. The memory structure according to claim 1, wherein the trench-type gate structure comprises:
   a gate, wherein the gate also serves as a word line;
   a gate dielectric layer disposed between the substrate and the gate; and
   a cap layer covering the gate.

8. The memory structure according to claim 7, wherein a portion of the second floating body is directly above the trench-type gate structure.

9. The memory structure according to claim 1, wherein the trench-type gate structure extends from the substrate to be above the substrate and beside the second floating body.

10. The memory structure according to claim 1, further comprising a bit line disposed above the second source/drain region and electrically connecting to the second source/drain region.

11. The memory structure according to claim 1, wherein one side of the trench-type gate structure abuts upon the isolation structure and a bottom of the trench-type gate structure is located within the first source/drain region.

* * * * *